(12) United States Patent
Yu et al.

(10) Patent No.: US 11,762,762 B1
(45) Date of Patent: Sep. 19, 2023

(54) STATIC AND AUTOMATIC INFERENCE OF INTER-BASIC BLOCK BURST TRANSFERS FOR HIGH-LEVEL SYNTHESIS

(71) Applicant: Xilinx, Inc., San Jose, CA (US)

(72) Inventors: Lin-Ya Yu, San Jose, CA (US); Alexandre Isoard, San Jose, CA (US); Hem C. Neema, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 17/656,236

(22) Filed: Mar. 24, 2022

(51) Int. Cl.
*G06F 11/36* (2006.01)
*G06F 8/30* (2018.01)

(52) U.S. Cl.
CPC .......... *G06F 11/3688* (2013.01); *G06F 8/311* (2013.01)

(58) Field of Classification Search
CPC .............................. G06F 8/311; G06F 11/3688
See application file for complete search history.

(56) References Cited

U.S. PATENT DOCUMENTS

| | | | |
|---|---|---|---|
| 2002/0103959 A1* | 8/2002 | Baker, Jr. ........... | G11C 16/3427 711/E12.079 |
| 2005/0193359 A1* | 9/2005 | Gupta ..................... | G06F 30/30 716/104 |
| 2007/0162900 A1* | 7/2007 | Biswas ................. | G06F 8/4442 717/136 |
| 2008/0208560 A1* | 8/2008 | Johnson .................. | H04L 9/002 703/22 |
| 2014/0215183 A1* | 7/2014 | Yazdani .............. | G06F 9/30058 712/24 |

OTHER PUBLICATIONS

Djoudi et al., "MAQAO: Modular Assembler Quality Analyzer and Optimizer for Itanium 2" (Year: 2005).*
A Akoglu, "Application Specific Reconfigurable Architecture Design Methodology" (Year: 2005).*
Intel, Intel® FPGA SDK for OpenCL™ Pro Edition, Best Practices Guide, Updated for Intel® Quartus® Prime Design Suite: 21.3, ID: 683521, Version: 2021.10.04, 7 pages.
Richard Johnson, et al., The Program Structure Tree: Computing Control Regions in Linear Time, Department of Computer Science Cornell University, Ithaca, NY 14853, 15 pages.
Jussi Vanhatalo, et al., The Refined Process Structure Tree, IBM Zurich Research Laboratory, Säumerstrasse 4, CH-8803 Rüschlikon, Switzerland, Institute of Architecture of Application Systems, University of Stuttgart, Jniversitatsstrasse 38, D-70569 Stuttgart, Germany, Jan. 16, 2009, 53 pages.
https://llvm.org/devmtg/2019-04/talks.html.

\* cited by examiner

*Primary Examiner* — Phillip H Nguyen
(74) *Attorney, Agent, or Firm* — Kevin T. Cuenot (57) ABSTRACT

Static and automatic realization of inter-basic block burst transfers for high-level synthesis can include generating an intermediate representation of a design specified in a high-level programming language, wherein the intermediate representation is specified as a control flow graph, and detecting a plurality of basic blocks in the control flow graph. A determination can be made that plurality of basic blocks represent a plurality of consecutive memory accesses. A sequential access object specifying the plurality of consecutive memory accesses of the plurality of basic blocks is generated. A hardware description language (HDL) version of the design is generated, wherein the plurality of consecutive memory accesses are designated in the HDL version for implementation in hardware using a burst mode.

20 Claims, 5 Drawing Sheets

STATIC AND AUTOMATIC INFERENCE OF INTER-BASIC BLOCK BURST TRANSFERS FOR HIGH-LEVEL SYNTHESIS

RESERVATION OF RIGHTS IN COPYRIGHTED MATERIAL

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

This disclosure relates to high-level synthesis and, more particularly, to inferring inter-basic block burst transfers from a high-level description of a design for implementation in an integrated circuit.

BACKGROUND

High-Level Synthesis (HLS) refers to a technology that converts a design specified in a high-level programming language into a circuit design specified in a hardware description language. The circuit design may then be realized within an integrated circuit (IC). The quality of implementation of the circuit design within the IC often depends on the ability of the implementation tools to recognize particular characteristics in the high-level programming language source code of the design that lend themselves to particular features available in the IC and/or hardware.

For example, most hardware supports a data transfer mode referred to as "burst mode." In general, burst mode is a temporary high-speed data transmission mode used to facilitate sequential data transfer at maximum throughput. Depending on the particular hardware implementation, data transfer speeds using burst mode are often two to five times faster than normal transmission protocols. This means that effective utilization of burst mode when implementing a design in an IC may significantly improve throughput of the resulting hardware. Current Electronic Design Automation (EDA) tools that perform HLS, however, are limited in their ability to recognize opportunities in the source code of a design for applying burst mode.

SUMMARY

In one or more example implementations, a method can include generating an intermediate representation of a design specified in a high-level programming language. The intermediate representation may be specified as a control flow graph. The method can include detecting a plurality of basic blocks in the control flow graph. The method can include determining that the plurality of basic blocks represent a plurality of consecutive memory accesses. The method can include generating a sequential access object specifying the plurality of consecutive memory accesses of the plurality of basic blocks. The method also can include generating a hardware description language (HDL) version of the design wherein the plurality of consecutive memory accesses are designated for implementation in hardware using a burst mode.

In one or more example implementations, a system includes a processor configured to initiate operations. The operations can include generating an intermediate representation of a design specified in a high-level programming language. The intermediate representation may be specified as a control flow graph. The operations can include detecting a plurality of basic blocks in the control flow graph. The operations can include determining that the plurality of basic blocks represent a plurality of consecutive memory accesses. The operations can include generating a sequential access object specifying the plurality of consecutive memory accesses of the plurality of basic blocks. The operations can include generating an HDL version of the design wherein the plurality of consecutive memory accesses are designated for implementation in hardware using a burst mode.

In one or more example implementations, a computer program product includes one or more computer readable storage media, and program instructions collectively stored on the one or more computer readable storage media. The program instructions are executable by computer hardware to initiate operations as described within this disclosure.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

DETAILED DESCRIPTION

This disclosure relates to high-level synthesis (HLS) and, more particularly, to inferring inter-basic block burst transfers from a high-level description of a design intended for implementation in an integrated circuit (IC). In accordance with the inventive arrangements described within this disclosure, an HLS compiler is capable of automatically analyzing a user design specified in a high-level programming language to detect opportunities for implementing burst transfers in the resulting hardware.

Existing HLS techniques that perform static analysis are often limited to recognizing an individual basic block from the design as an opportunity for implementing a burst transfer. In one aspect, the inventive arrangements described herein are capable of building chains of two or more basic blocks called "a region" and determining whether the region represents a series of consecutive memory accesses that may be realized in hardware using a burst transfer mode.

In another aspect, the inventive arrangements described herein are capable of chaining together two or more regions and determining whether the memory accesses of the chain of regions are consecutive such that the memory accesses of the chain of regions may be realized in hardware using a burst transfer mode. In still another aspect, the inventive arrangements described herein are capable of determining whether consecutive memory accesses can be identified across a loop construct detected in the design. In response to detecting consecutive memory accesses across a loop construct, the inventive arrangements described herein are capable of creating still a larger set of consecutive memory accesses, across the loop construct, for realization in hardware using a burst transfer mode.

Further aspects of the inventive arrangements are described below with reference to the figures.

Figure 1:
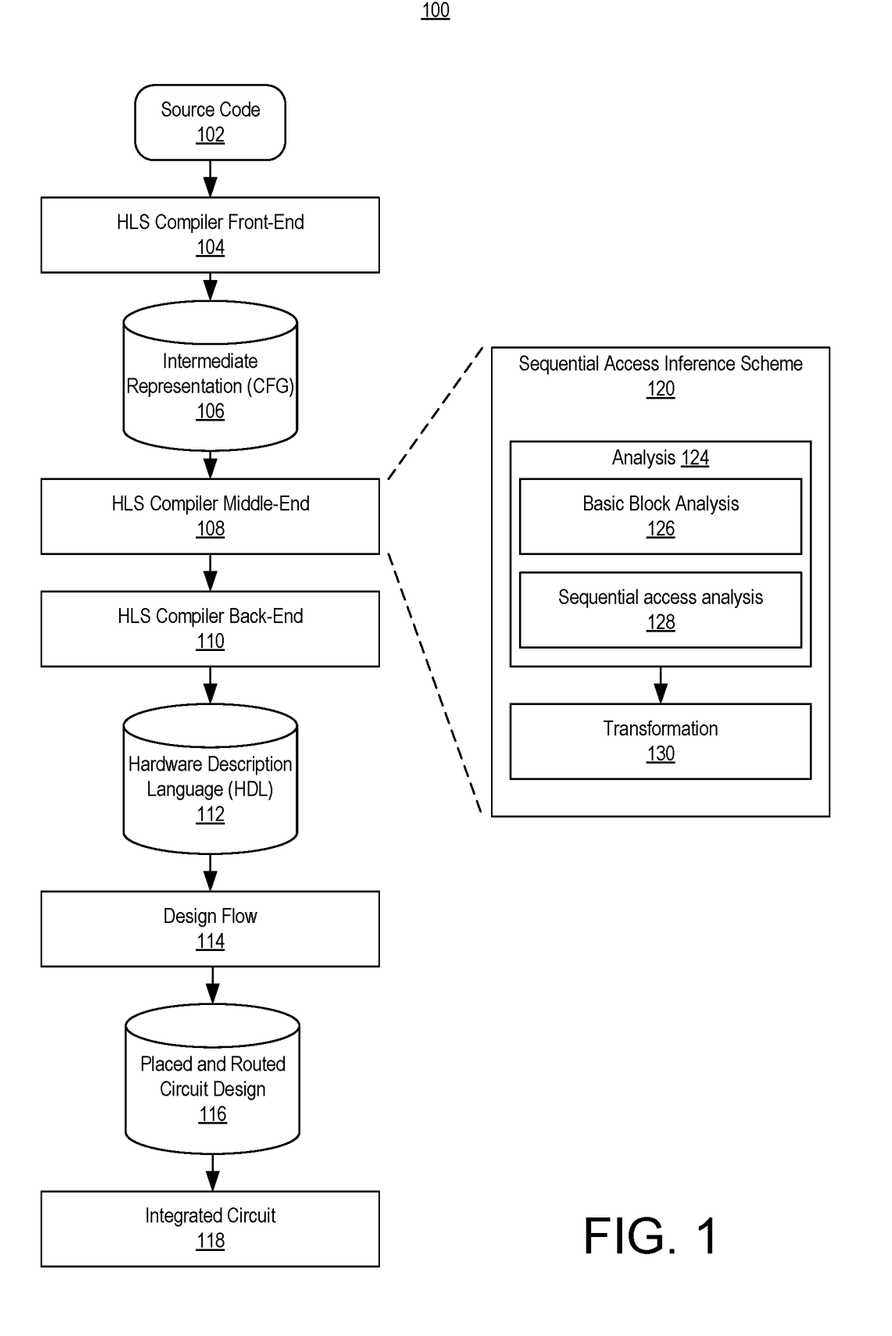
FIG. 1 illustrates an example flow performed by an Electronic Design Automation (EDA) system for realizing a user-specified design in hardware.

FIG. 1 illustrates an example flow 100 performed by an Electronic Design Automation (EDA) system. The EDA system is capable of realizing a user-specified design in hardware. The EDA system may be implemented as a data processing system, e.g., a computer, executing suitable operational software or program code to perform one or more of the operations described within this disclosure. An example of a data processing system that may be used to implement an EDA system and that is capable of performing the example flow 100 of FIG. 1 is described in connection with FIG. 4.

In the example of FIG. 1, the EDA system may include an HLS compiler that, when executed, is capable of generating a hardware description language (HDL) version of a design received as a source such as source code 102. In general, the HLS compiler may include a HLS compiler front-end 104, a HLS compiler middle-end 108, and a HLS compiler back-end 110.

In the example, source code 102 is provided to HLS compiler front-end 104. Source code 102 may be for a user design intended for implementation in an IC. Source code 102 may be specified as a high-level programming language. Examples of high-level programming languages include, but are not limited to, C, C++, and OpenCL.

HLS compiler front-end 104 may include a static analyzer and one or more source code analysis tools. HLS compiler front-end 104 is capable of generating an intermediate representation 106 of source code 102. In one aspect, the intermediate representation 106 may be specified as an LLVM intermediate representation as is used by compilers to represent source code for further processing. The intermediate representation 106 may be specified as a control flow graph (CFG).

In the example, the intermediate representation 106 is provided to HLS compiler middle-end 108. HLS compiler middle-end 108 is capable of performing a sequential access inference scheme 120 on the CFG as shown in FIG. 1 and as described in greater detail below. The results from HLS compiler middle-end 108 are provided to HLS compiler back-end 110. HLS compiler back-end 110 is capable of translating the results obtained from HLS compiler middle-end 108 into HDL 112. In translating the results obtained from HLS compiler middle-end 108, HLS compiler back-end 110 is capable of detecting particular objects within the results that have been designated for implementation using a burst transfer mode and implement the burst transfer mode in the resulting HDL 112.

For example, a series of read accesses recognized in source code 102 as being consecutive may be designated for implementation in hardware using the burst transfer mode through the sequential access inference scheme 120.

Accordingly, in translating the results from the HLS compiler middle-end 108 into HDL 112, the HLS compiler back-end 110 is capable of representing a plurality of memory reads designated for implementation using the burst transfer mode as a single, larger memory read implemented as a burst transfer. A burst transfer is a well-known technique to resolve the access data time bottleneck in a design. A burst transfer aggregates sequential (or consecutive) memory accesses and processes the memory accesses without performing all the steps for each memory access to improve performance when communicating with a memory subsystem. A consecutive memory access refers to a plurality of sequentially executed memory accesses where each memory access accesses a next address in the memory such that the plurality of consecutive memory accesses access a continuous region of memory. Further, consecutive memory accesses may not be separated by any side effect instructions when spanning across basic blocks, regions, or loops.

The HDL 112 may be processed through a design flow 114. Design flow 114 may include a synthesis process, a placement process, and a routing process. Design flow 114 may generate a placed and routed circuit design 116. In the example, the placed and routed circuit design 116 may be specified in any of a variety of different formats including, for example, as configuration data or a configuration bitstream, that may be loaded into an IC such as IC 118 thereby physically implementing, e.g., realizing, the design specified by source code 102 in IC 118.

IC 118 may be implemented as any of a variety of different types of ICs including, but not limited to, an Application-Specific IC, a System-on-Chip, a programmable IC (e.g., an IC including at least some programmable circuitry, where programmable logic is a type of programmable circuitry), or the like.

For purposes of illustration, Example 1 depicts an example of source code 102. The source code of Example 1 is specified in C++. As noted, the source code 102 may be specified using any of a variety of different high-level programming languages (e.g., C, C++, and/or OpenCL).

Example 1

```
constexpr size_t N = 9;
constexpr size_t M = 3;
void example(int *a, int *b, int f) {
// equivalent to factor 3 cyclic partition on dim 1 for buff[N][M]
    int buff_0[M][M];
    int buff_1[M][M];
    int buff_2[M][M];
    for (size_t i = 0; i < N; ++i)
        for (size_t j = 0; j < M; ++j) {
#pragma HLS UNROLL
            int v = a[i*M + j];
            switch (i % 3) {
                case 0:
                    buff_0[i/3][j] = v / f;
                    break;
                case 1:
                    buff_1[i/3][j] = v*f;
                    break;
```

```
          case 2:
              buff_2[i/3][j] = v + f;
              break;
          default:
              break;
      }
  }
...
}
```

In one aspect, HLS compiler middle-end 108 is capable of performing sequential access inference scheme 120 as one or more processing passes through intermediate representation 106, e.g., the CFG. In one aspect, as part of generating the CFG, any loops within the intermediate representation 106 of source code 102 may be unrolled in accordance with any specified compiler directives such as "#pragma HLS UNROLL" in Example 1.

Figure 2:
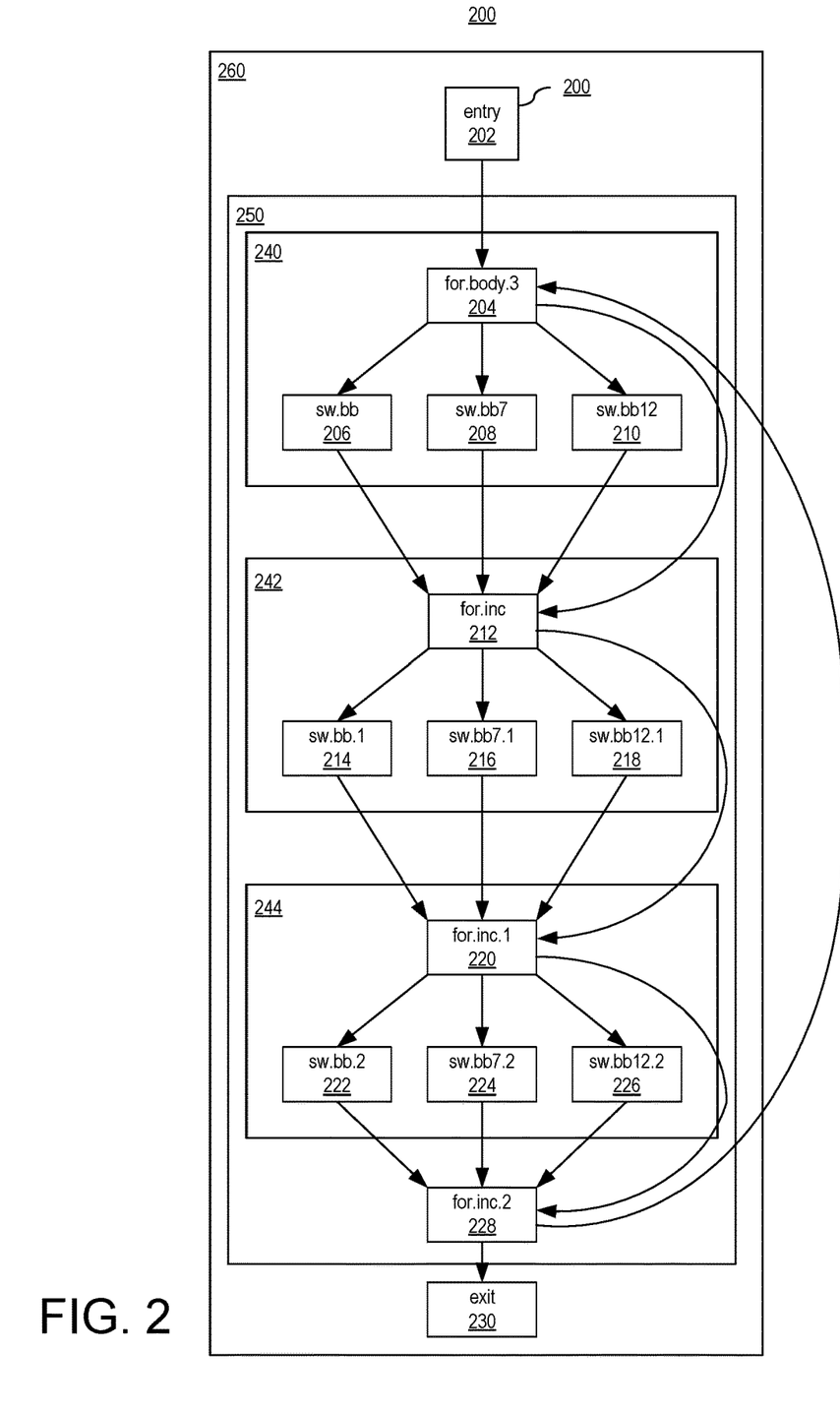
FIG. 2 illustrates an example control flow graph that may be generated by the EDA system of FIG. 1.

FIG. 2 illustrates an example CFG 200 that may be generated by the HLS compiler front-end 104. For example, the CFG 200 may be generated by HLS compiler front-end 104 from the source code of Example 1. In the example, sequential access inference scheme 120 includes analysis 124 (e.g., operations) and a transformation 130 may be performed. In the example of FIG. 1, the analysis 124 and the transformation 130 may be called in order for each function of source code 102.

In general, analysis 124 includes basic block analysis 126 and sequential access analysis 128. Basic block analysis 126, as performed by HLS compiler middle-end 108, includes detecting basic blocks within the CFG. In the example of FIG. 2, HLS compiler middle-end 108 has determined that each of blocks 202, 204, 206, 208, 210, 212, 214, 216, 218, 220, 222, 224, 226, 228, and 230 is a basic block. The term "basic block" means a list of one or more instructions in execution order that have a single entry point and a single exit point. The list of the instructions form the body portion of the basic block. In one aspect, the basic blocks may also represent one or more memory accesses.

In one aspect, as part of performing the basic block analysis 126, the HLS compiler middle-end 108 is capable of forming regions from the basic blocks. In one or more example implementations, basic block analysis 126 is capable of generating regions by decomposing each function into single entry, single exit basic block fragments. The fragments are combined to form regions such that, for each region, the exit basic block of the region is guaranteed to post dominate the entry basic block of the region; and the entry basic block of the region is guaranteed to dominate the exit basic block of the region. A node "x" is said to dominate node "y" in a directed graph if every path from "start" to "y" includes "x." A node "x" is said to post dominate a node "y" if every path from "y" to the "end" includes "x." The HLS compiler is capable of grouping the plurality of basic blocks into a plurality of regions using the foregoing criteria.

Further aspects of generating regions are described within Pearson et al., "The Program Structure Tree: Computing Control Regions in Linear Time," Proceedings of the ACM SIGPLAN 1994 conference on Programming language design and implementation, Orlando, Fla., USA (Jun. 20-24, 1994), and Vanhatalo et al., "The Refined Process Structure Tree," Data Know!. Eng. 68 793-818 (2009), each being incorporated herein by reference.

Referring to the example of FIG. 2, the basic blocks 204-226 are organized into regions 240, 242, and 244. In general, each of regions 240, 242, and 244 represents the body portion of the inner loop of the source code of Example 1 depicted in Example 2 below. Within the example of FIG. 2, the loop body has been unrolled representing 3 iterations of the inner loop corresponding to the 3 times that "a" is loaded.

Example 2

```
int v = a[i*M + j];
switch (i % 3) {
    case 0:
        buff_0[i/3][j] = v / f;
        break;
    case 1:
        buff_1[i/3][j] = v*f;
        break;
    case 2:
        buff_2[i/3][j] = v + f;
        break;
    default:
        break;
}
```

Referring to the source code of Example 1 and Example 2, case 0 corresponds to basic blocks 206, 214, and 222. Case 1 corresponds to basic blocks 208, 216, and 224. Case 2 corresponds to basic blocks 210, 218, and 226. The default case corresponds to the edge that directly connects basic block 204 to basic block 212, the edge that directly connects basic block 212 to basic block 220, and the edge that directly connects basic block 220 to basic block 228. As shown, block 228 connects to the exit block 230. Since the inner loop shown in Example 2 is unrolled, each iteration, or repetition, of the load "a" will reside in a different basic block corresponding to blocks 204, 212, and 220. In this situation, the loads cross, or span, multiple basic blocks and are difficult to analyze for consecutiveness particularly when only considered with respect to basic block zones and loop zones without the use of regions.

Sequential access analysis 128, as performed by HLS compiler middle-end 108, may be performed to determine whether a plurality of basic blocks represent a plurality of consecutive memory accesses. Sequential access analysis 128 may be performed during a separate processing pass through source code 102. The sequential access analysis 128 receives region information generated by the basic block analysis 126. For example, the sequential access analysis 128 may receive a region tree. In one aspect, the sequential access analysis 128 is capable of traversing, or walking, the CFG having the region information (e.g., a region tree) in a bottom-up fashion. Sequential access analysis 128, for example, starts with basic blocks first, moves to outer regions, and then to the next outer regions. For each region, the sequential access analysis 128 tries to infer, or extend, a sequential access chain specifying consecutive memory accesses through the following three kinds of zones: basic blocks, the current region, and the loop.

For example, the HLS compiler middle-end 108 is capable of performing a bottom-up analysis as follows. HLS compiler middle-end 108 is capable of evaluating a single basic block to determine whether the access pointer for the single basic block is continuous in terms of the physical address being accessed. HLS compiler middle-end 108 then tries to extend the analysis to further basic blocks for a region, e.g., inside of a loop. HLS compiler middle-end 108 is then capable of extending the analysis of memory accesses across two or more regions to determine whether such memory accesses across multiple regions are continuous. HLS compiler middle-end 108 may then attempt to extend the analysis of memory accesses at the loop level to the loop label.

In one or more example implementations, for each zone (e.g., basic block, region, and loop), the sequential access analysis 128 first collects memory accesses in execution order with the same direction (e.g., read or write) and the same underlying object into a map of lists (e.g., {Underlying Object, Accesses}). Having generated the map of lists, the memory accesses in the same list are guaranteed to be on the same underlying object, in the same direction, and one after another in terms of execution time.

In each of the generated lists, the sequential access analysis 128 is capable of checking consecutiveness of the memory accesses in terms of space. That is, for each generated list, the sequential access analysis 128 is capable of checking that the memory accesses of the list are directed to consecutive memory addresses. In one aspect, the sequential access analysis 128 is capable of checking consecutiveness by using a scalar evolution (SCEV) analysis representation. Using SCEV analysis, the HLS compiler middle-end 108 is capable of determining how a pointer evolves over time. Referring to Example 1, the SCEV analysis may be used to determine the addresses corresponding to "i." In each list, HLS compiler middle-end 108 is capable of checking consecutiveness in terms of address space using an SCEV implementation such as SCEV Canon.

In the context of intermediate representation 106 and a CFG, SCEV is an analysis representation used to determine how a value will evaluate during execution time. There may be multiple equivalent representations for a given value, e.g., a memory address to be read, which makes comparison difficult between different SCEVs. SCEV Canon is a known SCEV technique that may be used in many different types of analysis and optimizations in LLVM including, but not limited to, loop strength reduction, induction variable substitution, and memory access analysis. SCEV Canon is capable of performing canonicalization and further simplification on SCEV representations. For example, using SCEV Canon, the HLS compiler is capable of checking the equivalence of SCEVs between different SCEV implementations. Thus, using SCEV Canon, the HLS compiler is capable of canonicalizing SCEV representations into the same form to better determine whether any given pair of SCEV representations have an expected difference (e.g., are the same). SCEV Canon may be used to prove that memory accesses are consecutive, e.g., access consecutive memory addresses, in a fragment. In the context of this disclosure, SCEV Canon may be used to determine, at least in part, consecutiveness for memory accesses that span basic blocks, regions, and/or loops.

For example, two access pointers with analyzed SCEVs of (S*(A+B))) and ((AS+BS)+C) may be canonicalized using SCEV Canon into (AS+BS) and (AS+BS)+C, respectively. By application of canonicalization using SCEV Canon, the HLS compiler is capable of determining that the difference between the two pointers is "C."

In performing the sequential access analysis 128, the HLS compiler middle-end 108 is capable of obtaining the SCEVs for each pair of access pointers for a memory access from a list (e.g., of a same direction) and separate the SCEVs into SCEV_Base_Pointer and SCEV_Offset. By evaluating the pair as (SCEV_Base_Pointer_1−SCEV_Base_Pointer_0)+ (SCEV_Offset_1−SCEV_Offset_0)==(size of access data type in byte*access length), the HLS compiler middle-end 108 is capable of determining whether a given pair of accesses are consecutive.

For purposes of illustration and referring to Example 1, there would be 3 load accesses to array "a" after unrolling the inner loop. The access addresses of the three addresses expressed in the form of (base pointer)+(offset) is shown below.

(a+M*4*i)+(0)
(a+M*4*i)+(4)
(a+M*4*i)+(8)

In this example, the value 4 is used since the "int" type is 4 bytes. The HLS compiler collects the foregoing accesses in execution order which guarantees the consecutiveness of the accesses in time. The HLS compiler applies the (SCEV_Base_Pointer_1−SCEV_Base_Pointer_0)+(SCEV_Offset_1−SCEV_Offset_0) expression to the first and second accesses as follows: (a+M*4*i)−(a+M*4*i)+(4)−(0)=4. The HLS compiler is capable of determining that the first and second accesses are consecutive in space by comparing the distance (e.g., the result) of 4 bytes with the total access size of the first load, which is also 4 bytes. The HLS compiler, by determining the equivalence, determines that the two accesses are consecutive in space. The HLS compiler may apply the same technique to the second and third accesses.

Referring again to FIG. 2, the HLS compiler is capable of determining that the 3 accesses each of length 1 in separate basic blocks 204, 212, and 220, which are in separate regions, may be combined and extended in a sequential access chain of 3 memory accesses corresponding to region 250. Having created regions of basic blocks and chained together regions 240, 242, and 244 into a larger region 250, the HLS compiler is capable of analyzing the loop zone. The HLS compiler is capable of determining whether a longer sequential access chain may be formed across the loop, e.g., the outer loop corresponding to "for (size t i=; i<N; ++i)" which iterates or repeats 9 times and is represented by region 260. For accesses under a loop, the HLS compiler is capable of using the affine SCEV to find the stride and test the consecutiveness through the size of access data type, total access length of the loop body, and the stride to find the final length of 27 for the sequential access chain.

For purposes of illustration and referring to Example 1, the HLS compiler generates a load burst of length 3 that starts at the address of "a[i*M+0]" for the unrolled inner loop. The start address is represented with an affine SCEV as "{a, +, M*4}<outer loop>" which means that at each loop iteration "i", the address is "a+M*4*i". The size of each access is 4 bytes since each burst load accesses 1 int type element on "a". In this example, the HLS compiler divides the stride "M*4" by 4, which leaves "M". The HLS compiler determines that "M" is equivalent to the previous inferred region burst length of 3. The HLS compiler compares M in this case to the previous inferred region burst length of 3. In response to determining the equivalence between M in this case and the previous inferred region burst length of 3, the HLS compiler determines that there is no hole or gap (e.g., which occurs when M is less than 3) and no overlap (e.g., which occurs when M is greater than 3) for the load accesses between iterations. In response to making this determination, the HLS compiler extends the region burst on the loop. The inferred burst on the loop is extended to a length of 27 (e.g., 3*loop trip count(N)=27).

The HLS compiler middle-end 108 is also capable of checking for any side effect instructions that exist between each of the zones. An instruction is said to have a side effect if the instruction modifies some state variable value(s)

outside the instruction's local environment and, as such, has an observable effect besides returning a value to the invoker of the instruction. The presence of a side effect instruction between a first zone and a second zone (e.g., whether basic blocks, regions, or loops), indicates that the chain of sequential memory accesses of the first zone does not extend into the second zone.

In the example of FIG. 2, the HLS compiler middle-end 108 determines that there are no such instructions between regions 240, 242, and 244. Similarly, there are no such instructions that are executed between iterations of the outer loop. For example, if moving from region 240 to region 242 or from region 242 to region 244, memory accesses in the conditional region may not be included in a burst transfer. The HLS compiler middle-end 108 must prove that program execution will always flow from one region (e.g., a first region) to another region (e.g., a second region) in order to determine that memory accesses of the first and second regions may be continuous. It should be appreciated that in order to effectuate a burst transfer of memory accesses that span two or more basic blocks, two or more regions, or a loop, the memory addresses used for the respective accesses must also be continuous using the pointers evaluation techniques previously described. In any case, with respect to CFG 200, there may not be any path from the first region that allows execution (e.g., program control) to avoid going through the second region. The path must be unconditional.

In one aspect, the HLS compiler middle-end 108 is capable of checking the dominance and post dominance conditions previously described herein between two regions. In one aspect, the HLS compiler middle-end 108 is capable of generating a dominator and post dominator tree data structure to check the dominance and post dominator conditions in a more computationally efficient manner.

In block 130, the HLS compiler performs a transformation. In block 130, the HLS compiler is capable of generating a sequential access object specifying the plurality of sequential memory accesses, which may span across two or more basic blocks, two or more regions, and/or a loop. In one aspect, the transformation 130 may be performed in a pass that takes hardware information relating to the target platform (e.g., IC) in which the design will be implemented, and transforms the valid sequential access chains into sequential access intrinsics.

As an illustrative and non-limiting example, the hardware or IC may utilize a memory mapped interface that conforms to a particular communication protocol. An example is the Advanced Microcontroller Bus Architecture (AMBA) eXtensible Interface (AXI) (hereafter "AXI") protocol and communication bus. In generating the sequential access intrinsics, the transformation 130 is capable, for example, of determining the type of interface on the target IC or hardware over which the data transfer will occur and whether the interface supports burst transfers. In response to determining that the interface does support burst transfers, the transformation 130 may include or generate the sequential access intrinsics for the particular interface that will be used for purposes of HDL generation. The sequential access intrinsics ensure that the resulting HDL is interpreted correctly during the design flow 114 to implement the burst transfer mode for the data transfer(s) using the determined interface.

In one aspect, the sequential access intrinsics may be functions available for use with particular computer-based languages handled specially by the HLS compiler. For example, the HLS compiler may substitute a sequence of automatically generated instructions for a sequential access intrinsic. In this example, the automatically generated instructions may be instructions that, when translated into HDL 112, specify a burst transfer mode to be used in the target hardware for performing the valid sequential access chains given the particular interface to be used.

The results generated by the HLS compiler middle-end 108 in performing the sequential access inference scheme 120 are provided to the HLS compiler back-end 110 as described for translation into HDL 112. In the resulting HDL 112, the plurality of sequential memory accesses (e.g., the sequential access chains) are designated for implementation in hardware using a burst mode.

Referring again to the example of FIG. 2, the resulting burst transfer that is implemented in hardware is for 27 bytes of data. This burst transfer spans basic blocks, regions 240, 242, and 244, into region 250, and into region 260. Without applying the various techniques described herein during compilation, the 27 bytes of data may be obtained through 27 individual read operations which may significantly reduce throughput of the resulting hardware.

The inventive arrangements described herein provide an automatic and static, e.g., compile time, HLS process for implementing a design in hardware using burst transfers. The techniques described herein are automatic in that a designer need not include compiler directives that indicate the desire for burst transfers to be implemented for particular source code constructs and/or use specialized high-level programming language libraries intended for burst transfer mode implementation in hardware. Rather, the HLS compiler is capable of automatically detecting opportunities for burst transfers from a user design even in cases where the source code does not include such compiler directives and/or use specialized libraries. Further, the particular burst transfers that may be realized in hardware may be larger than otherwise possible as the burst transfers may extend across basic blocks, across regions, and/or across loops.

The static, or compile time, approach described herein also promotes a more efficient hardware implementation of a user design that does not require significant resources on the IC. Some techniques for implementing burst transfers in a user design operate dynamically in the realized hardware. That is, the EDA tool may insert additional circuitry such as load-store circuits, that is operable in the resulting hardware to automatically determine when and/or whether to perform a burst transfer during operation of the IC. The insertion of the additional circuitry into the user's design, however, may consume significantly more resources in the resulting hardware than had such circuit structures not been added. Such resources are used, and therefore unavailable for use by the user's design, regardless of whether such circuitry ever determines that a burst transfer may be performed. In addition, the insertion of specialized circuitry for performing dynamic burst transfer detection and implementation may require the use of specialized hardware libraries that may reduce the portability of the user's design among different ICs.

Figure 3:
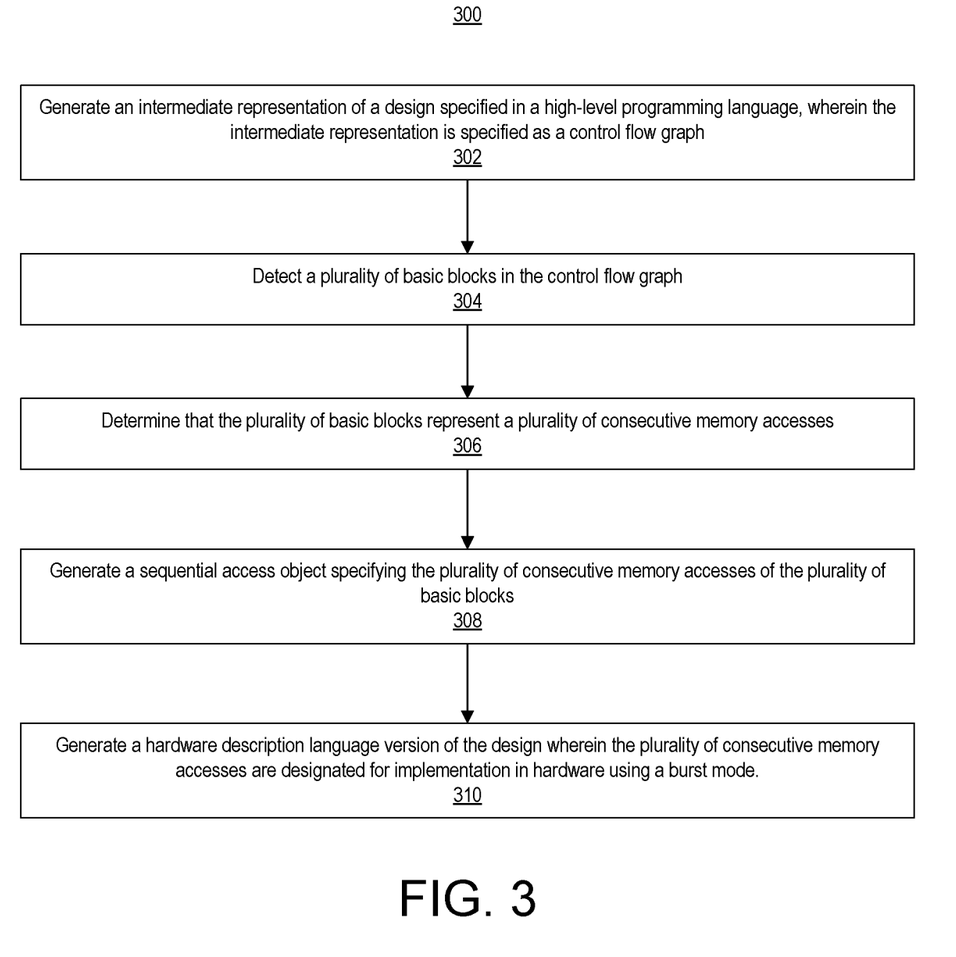
FIG. 3 illustrates an example method of operation for an EDA system including a High-Level Synthesis compiler.

FIG. 3 illustrates an example method 300 of operation for an EDA system (system) including an HLS compiler. In block 302, the system is capable of generating an intermediate representation of a design specified in a high-level programming language. The intermediate representation may be specified as a CFG. In block 304, the system is capable of detecting a plurality of basic blocks in the CFG. In block 306, the system is capable of determining that the plurality of basic blocks represent a plurality of consecutive memory accesses. In one aspect, determining that the plurality of basic blocks represent a plurality of consecutive memory access may include an analysis of the pointers to determine that the plurality of memory accesses are accessing consecutive memory addresses and checking the CFG or other data structure to ensure that the plurality of basic blocks, when viewed as a region or a loop, conform to the dominator and post dominator criteria described herein. In block 308, the system is capable of generating a sequential access object specifying the plurality of consecutive memory accesses of the plurality of basic blocks. In block 310, the system is capable of generating a hardware description language version of the design wherein the plurality of consecutive memory accesses are designated for implementation in hardware using a burst mode.

The foregoing and other implementations can each optionally include one or more of the following features alone or in combination. Some example implementations include all the following features in combination.

In one aspect, the system is capable of determining that the plurality of basic blocks represent a plurality of consecutive memory accesses by grouping the plurality of basic blocks into a plurality of regions, wherein each region includes two or more basic blocks of the plurality of basic blocks and has a single entry point and a single exit point.

The system is capable of determining that the plurality of memory accesses of the plurality of regions are consecutive. In one aspect, the plurality of consecutive memory accesses of the sequential access object include the plurality of memory accesses of the plurality of regions determined to be consecutive.

In another aspect, each region represents an instance of a body portion of a loop construct of the design. The loop construct may be unrolled. The system is capable of determining that the memory accesses of the instances of the body portion of the loop construct are consecutive.

In another aspect, the plurality of consecutive memory accesses of the sequential access object include the plurality of memory accesses of the instances of the body portion of the loop construct. As noted, the loop construct may be unrolled.

In another aspect, the loop construct is an inner loop contained in an outer loop. In that case, the system is capable of determining that memory accesses of each repetition of the inner loop, as controlled by the outer loop, are consecutive. The plurality of consecutive memory accesses of the sequential access object include the plurality of memory accesses of each repetition of the inner loop, as controlled by the outer loop.

Figure 4:
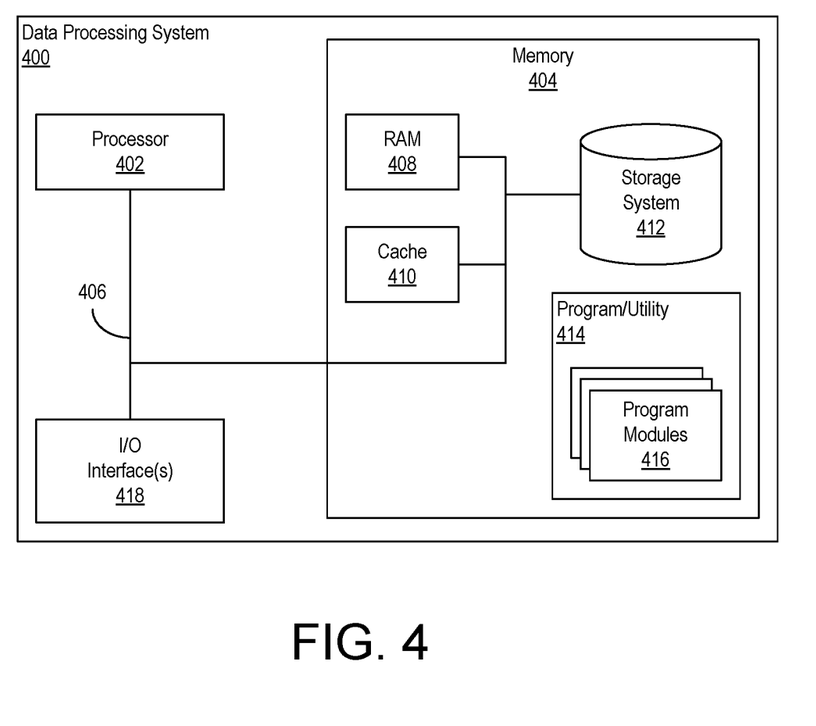
FIG. 4 illustrates an example implementation of a data processing system.

FIG. 4 illustrates an example implementation of a data processing system 400. As defined herein, "data processing system" means one or more hardware systems configured to process data, each hardware system including at least one processor programmed to initiate operations and memory.

The components of data processing system 400 can include, but are not limited to, a processor 402, a memory 404, and a bus 406 that couples various system components including memory 404 to processor 402. Processor 402 may be implemented as one or more processors. In an example, processor 402 is implemented as a central processing unit (CPU). As defined herein, the term "processor" means at least one circuit capable of carrying out instructions contained in program code. The circuit may be an integrated circuit or embedded in an integrated circuit. Processor 402 may be implemented using a complex instruction set computer architecture (CISC), a reduced instruction set computer architecture (RISC), a vector processing architecture, or other known architectures. Example processors include, but are not limited to, processors having an x86 type of architecture (IA-32, IA-64, etc.), Power Architecture, ARM processors, and the like.

Bus 406 represents one or more of any of a variety of communication bus structures. By way of example, and not limitation, bus 406 may be implemented as a Peripheral Component Interconnect Express (PCIe) bus. Data processing system 400 typically includes a variety of computer system readable media. Such media may include computer-readable volatile and non-volatile media and computer-readable removable and non-removable media.

Memory 404 can include computer-readable media in the form of volatile memory, such as random-access memory (RAM) 408 and/or cache memory 410. Data processing system 400 also can include other removable/non-removable, volatile/non-volatile computer storage media. By way of example, storage system 412 can be provided for reading from and writing to a non-removable, non-volatile magnetic and/or solid-state media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 406 by one or more data media interfaces. Memory 404 is an example of at least one computer program product.

Program/utility 414, having a set (at least one) of program modules 416, may be stored in memory 404. Program/utility 414 is executable by processor 402. By way of example, program modules 416 may represent an operating system, one or more application programs, other program modules, and program data. Program modules 416, upon execution, cause data processing system 400, e.g., processor 402, to carry out the functions and/or methodologies of the example implementations described within this disclosure. Program/utility 414 and any data items used, generated, and/or operated upon by data processing system 400 are functional data structures that impart functionality when employed by data processing system 400. As defined within this disclosure, the term "data structure" means a physical implementation of a data model's organization of data within a physical memory. As such, a data structure is formed of specific electrical or magnetic structural elements in a memory. A data structure imposes physical organization on the data stored in the memory as used by an application program executed using a processor.

For example, one or more program modules 416, when executed by processor 402, may implement one or more or all of the operations described in connection with the example flow 100 of FIG. 1.

Data processing system 400 may include one or more Input/Output (I/O) interfaces 418 communicatively linked to bus 406. I/O interface(s) 418 allow data processing system 400 to communicate with one or more external devices and/or communicate over one or more networks such as a local area network (LAN), a wide area network (WAN), and/or a public network (e.g., the Internet). Examples of I/O interfaces 418 may include, but are not limited to, network cards, modems, network adapters, hardware controllers, etc. Examples of external devices also may include devices that allow a user to interact with data processing system 400 (e.g., a display, a keyboard, and/or a pointing device) and/or other devices such as accelerator card.

Data processing system 400 is only one example implementation. Data processing system 400 can be practiced as a standalone device (e.g., as a user computing device or a server, as a bare metal server), in a cluster (e.g., two or more interconnected computers), or in a distributed cloud computing environment (e.g., as a cloud computing node) where tasks are performed by remote processing devices that are linked through a communications network. In a distributed cloud computing environment, program modules may be located in both local and remote computer system storage media including memory storage devices.

As used herein, the term "cloud computing" refers to a computing model that facilitates convenient, on-demand network access to a shared pool of configurable computing resources such as networks, servers, storage, applications, ICs (e.g., programmable ICs) and/or services. These computing resources may be rapidly provisioned and released with minimal management effort or service provider interaction. Cloud computing promotes availability and may be characterized by on-demand self-service, broad network access, resource pooling, rapid elasticity, and measured service.

The example of FIG. 4 is not intended to suggest any limitation as to the scope of use or functionality of example implementations described herein. Data processing system 400 is an example of computer hardware that is capable of performing the various operations described within this disclosure. In this regard, data processing system 400 may include fewer components than shown or additional components not illustrated in FIG. 4 depending upon the particular type of device and/or system that is implemented. The particular operating system and/or application(s) included may vary according to device and/or system type as may the types of I/O devices included. Further, one or more of the illustrative components may be incorporated into, or otherwise form a portion of, another component. For example, a processor may include at least some memory.

Data processing system 400 may be operational with numerous other general-purpose or special-purpose computing system environments or configurations. Examples of computing systems, environments, and/or configurations that may be suitable for use with data processing system 400 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Some computing environments, e.g., cloud computing environments and/or edge computing environments using data processing system 400 or other suitable data processing system, generally support the FPGA-as-a-Service (FaaS) model. In the FaaS model, user functions are hardware accelerated as circuit designs implemented within programmable ICs operating under control of the (host) data processing system. Other examples of cloud computing models are described in the National Institute of Standards and Technology (NIST) and, more particularly, the Information Technology Laboratory of NIST.

Figure 5:
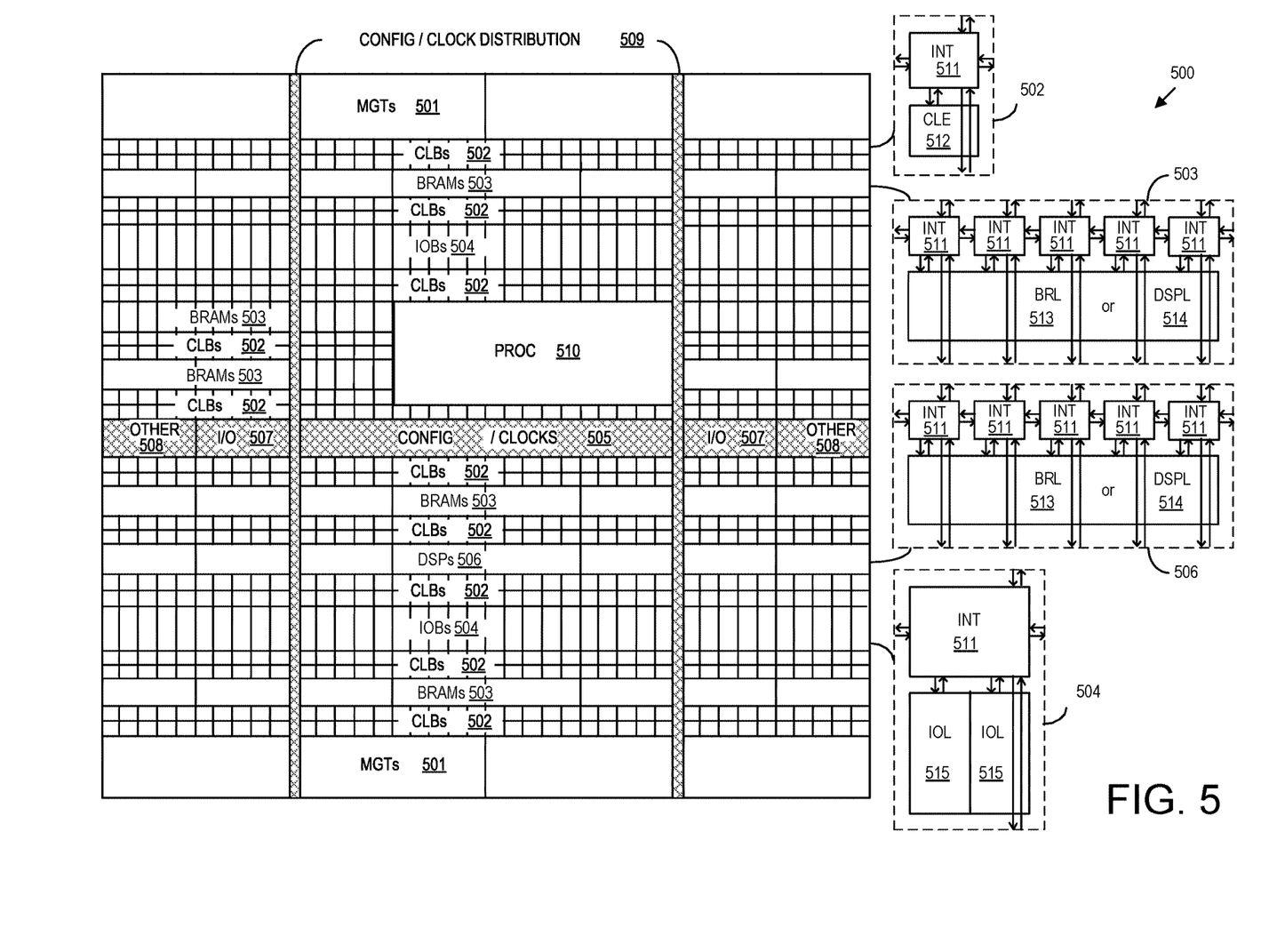
FIG. 5 illustrates an example architecture for an integrated circuit.

FIG. 5 illustrates an example architecture 500 for an IC such as IC 118 of FIG. 1. In one aspect, architecture 500 may be implemented within a programmable IC. A programmable IC is an IC with at least some programmable circuitry. Programmable circuitry may include programmable logic. For example, architecture 500 may be used to implement a field programmable gate array (FPGA). Architecture 500 may also be representative of a system-on-chip (SoC) type of IC. An example of an SoC is an IC that includes a processor that executes program code and one or more other circuits. The other circuits may be implemented as hardwired circuitry, programmable circuitry, and/or a combination thereof. The circuits may operate cooperatively with one another and/or with the processor.

As shown, architecture 500 includes several different types of programmable circuit, e.g., logic, blocks. For example, architecture 500 may include a large number of different programmable tiles including multi-gigabit transceivers (MGTs) 501, configurable logic blocks (CLBs) 502, random-access memory blocks (BRAMs) 503, input/output blocks (IOBs) 504, configuration and clocking logic (CONFIG/CLOCKS) 505, digital signal processing blocks (DSPs) 506, specialized I/O blocks 507 (e.g., configuration ports and clock ports), and other programmable logic 508 such as digital clock managers, analog-to-digital converters, system monitoring logic, and so forth.

In some ICs, each programmable tile includes a programmable interconnect element (INT) 511 having standardized connections to and from a corresponding INT 511 in each adjacent tile. Therefore, INTs 511, taken together, implement the programmable interconnect structure for the illustrated IC. Each INT 511 also includes the connections to and from the programmable logic element within the same tile, as shown by the examples included at the right of FIG. 5.

For example, a CLB 502 may include a configurable logic element (CLE) 512 that may be programmed to implement user logic plus a single INT 511. A BRAM 503 may include a BRAM logic element (BRL) 513 in addition to one or more INTs 511. Typically, the number of INTs 511 included in a tile depends on the height of the tile. As pictured, a BRAM tile has the same height as five CLBs, but other numbers (e.g., four) also may be used. A DSP tile 506 may include a DSP logic element (DSPL) 514 in addition to an appropriate number of INTs 511. An IOB 504 may include, for example, two instances of an I/O logic element (IOL) 515 in addition to one instance of an INT 511. The actual I/O pads connected to IOL 515 may not be confined to the area of IOL 515.

In the example pictured in FIG. 5, the shaded area near the center of the die, e.g., formed of regions 505, 507, and 508, may be used for configuration, clock, and other control logic. Shaded areas 509 may be used to distribute the clocks and configuration signals across the breadth of the programmable IC.

Some ICs utilizing the architecture illustrated in FIG. 5 include additional logic blocks that disrupt the regular columnar structure making up a large part of the IC. The additional logic blocks may be programmable blocks and/or dedicated circuitry. For example, a processor block depicted as PROC 510 spans several columns of CLBs and BRAMs.

In one aspect, PROC 510 may be implemented as dedicated circuitry, e.g., as a hardwired processor, that is fabricated as part of the die that implements the programmable circuitry of the IC. PROC 510 may represent any of a variety of different processor types and/or systems ranging in complexity from an individual processor, e.g., a single core capable of executing program code, to an entire processor system having one or more cores, modules, co-processors, interfaces, or the like.

In another aspect, PROC 510 may be omitted from architecture 500 and replaced with one or more of the other varieties of the programmable blocks described. Further, such blocks may be utilized to form a "soft processor" in that the various blocks of programmable circuitry may be used to form a processor that can execute program code as is the case with PROC 510.

The phrase "programmable circuitry" refers to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, circuit blocks shown in FIG. 5 that are external to PROC 510 such as CLBs 502 and BRAMs 503 are considered programmable circuitry of the IC.

In general, the functionality of programmable circuitry is not established until configuration data is loaded into the IC. A set of configuration bits may be used to program programmable circuitry of an IC such as an FPGA. The configuration bit(s) typically are referred to as a "configuration bitstream." In general, programmable circuitry is not operational or functional without first loading a configuration bitstream into the IC. The configuration bitstream effectively implements a particular circuit design within the programmable circuitry. The circuit design specifies, for example, functional aspects of the programmable circuit blocks and physical connectivity among the various programmable circuit blocks.

Circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 510.

In some instances, hardwired circuitry may have one or more operational modes that can be set or selected according to register settings or values stored in one or more memory elements within the IC. The operational modes may be set, for example, through the loading of a configuration bitstream into the IC. Despite this ability, hardwired circuitry is not considered programmable circuitry as the hardwired circuitry is operable and has a particular function when manufactured as part of the IC.

In the case of an SoC, the configuration bitstream may specify the circuitry that is to be implemented within the programmable circuitry and the program code that is to be executed by PROC 510 or a soft processor. In some cases, architecture 500 includes a dedicated configuration processor that loads the configuration bitstream to the appropriate configuration memory and/or processor memory. The dedicated configuration processor does not execute user-specified program code. In other cases, architecture 500 may utilize PROC 510 to receive the configuration bitstream, load the configuration bitstream into appropriate configuration memory, and/or extract program code for execution.

FIG. 5 is intended to illustrate an example architecture that may be used to implement an IC that includes programmable circuitry, e.g., a programmable fabric. For example, the number of logic blocks in a column, the relative width of the columns, the number and order of columns, the types of logic blocks included in the columns, the relative sizes of the logic blocks, and the interconnect/logic implementations included at the right of FIG. 5 are purely illustrative. In an actual IC, for example, more than one adjacent column of CLBs is typically included wherever the CLBs appear, to facilitate the efficient implementation of a user circuit design. The number of adjacent CLB columns, however, may vary with the overall size of the IC. Further, the size and/or positioning of blocks such as PROC 510 within the IC are for purposes of illustration only and are not intended as limitations.

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

As defined herein, the singular forms "a," "an," and "the" are intended to include the plural forms as well, unless the context clearly indicates otherwise.

As defined herein, the term "approximately" means nearly correct or exact, close in value or amount but not precise. For example, the term "approximately" may mean that the recited characteristic, parameter, or value is within a predetermined amount of the exact characteristic, parameter, or value.

As defined herein, the terms "at least one," "one or more," and "and/or," are open-ended expressions that are both conjunctive and disjunctive in operation unless explicitly stated otherwise. For example, each of the expressions "at least one of A, B, and C," "at least one of A, B, or C," "one or more of A, B, and C," "one or more of A, B, or C," and "A, B, and/or C" means A alone, B alone, C alone, A and B together, A and C together, B and C together, or A, B and C together.

As defined herein, the term "automatically" means without human intervention. As defined herein, the term "user" means a human being.

As defined herein, the term "computer readable storage medium" means a storage medium that contains or stores program code for use by or in connection with an instruction execution system, apparatus, or device. As defined herein, a "computer readable storage medium" is not a transitory, propagating signal per se. A computer readable storage medium may be, but is not limited to, an electronic storage device, a magnetic storage device, an optical storage device, an electromagnetic storage device, a semiconductor storage device, or any suitable combination of the foregoing. The various forms of memory, as described herein, are examples of computer readable storage media. A non-exhaustive list of more specific examples of a computer readable storage medium may include: a portable computer diskette, a hard disk, a RAM, a read-only memory (ROM), an erasable programmable read-only memory (EPROM or Flash memory), an electronically erasable programmable read-only memory (EEPROM), a static random-access memory (SRAM), a portable compact disc read-only memory (CD-ROM), a digital versatile disk (DVD), a memory stick, a floppy disk, or the like.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context.

As defined herein, the term "responsive to" and similar language as described above, e.g., "if," "when," or "upon," means responding or reacting readily to an action or event. The response or reaction is performed automatically. Thus, if a second action is performed "responsive to" a first action, there is a causal relationship between an occurrence of the first action and an occurrence of the second action. The term "responsive to" indicates the causal relationship.

As defined herein, the term "soft" in reference to a circuit means that the circuit is implemented in programmable logic or programmable circuitry. Thus, a "soft processor" means at least one circuit implemented in programmable circuitry that is capable of carrying out instructions contained in program code.

As defined herein, the term "output" means storing in physical memory elements, e.g., devices, writing to display or other peripheral output device, sending or transmitting to another system, exporting, or the like.

As defined herein, the term "real time" means a level of processing responsiveness that a user or system senses as sufficiently immediate for a particular process or determination to be made, or that enables the processor to keep up with some external process.

As defined herein, the term "substantially" means that the recited characteristic, parameter, or value need not be achieved exactly, but that deviations or variations, including for example, tolerances, measurement error, measurement accuracy limitations, and other factors known to those of skill in the art, may occur in amounts that do not preclude the effect the characteristic was intended to provide.

The terms first, second, etc. may be used herein to describe various elements. These elements should not be limited by these terms, as these terms are only used to distinguish one element from another unless stated otherwise or the context clearly indicates otherwise.

A computer program product may include a computer readable storage medium (or media) having computer readable program instructions thereon for causing a processor to carry out aspects of the inventive arrangements described herein. Within this disclosure, the term "program code" is used interchangeably with the term "computer readable program instructions." Computer readable program instructions described herein may be downloaded to respective computing/processing devices from a computer readable storage medium or to an external computer or external storage device via a network, for example, the Internet, a LAN, a WAN and/or a wireless network. The network may include copper transmission cables, optical transmission fibers, wireless transmission, routers, firewalls, switches, gateway computers and/or edge devices including edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations for the inventive arrangements described herein may be assembler instructions, instruction-set-architecture (ISA) instructions, machine instructions, machine dependent instructions, microcode, firmware instructions, or either source code or object code written in any combination of one or more programming languages, including an object-oriented programming language and/or procedural programming languages. Computer readable program instructions may include state-setting data. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some cases, electronic circuitry including, for example, programmable logic circuitry, an FPGA, or a PLA may execute the computer readable program instructions by utilizing state information of the computer readable program instructions to personalize the electronic circuitry, in order to perform aspects of the inventive arrangements described herein.

Certain aspects of the inventive arrangements are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, may be implemented by computer readable program instructions, e.g., program code.

These computer readable program instructions may be provided to a processor of a computer, special-purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the operations specified in the flowchart and/or block diagram block or blocks.

The computer readable program instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects of the inventive arrangements. In this regard, each block in the flowchart or block diagrams may represent a module, segment, or portion of instructions, which comprises one or more executable instructions for implementing the specified operations.

In some alternative implementations, the operations noted in the blocks may occur out of the order noted in the figures.

For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

What is claimed is:

1. A method, comprising:
generating an intermediate representation of a design specified in a high-level programming language, wherein the intermediate representation is specified as a control flow graph;
detecting a plurality of basic blocks in the control flow graph;
determining that the plurality of basic blocks represent a plurality of consecutive memory accesses;
generating a sequential access object specifying the plurality of consecutive memory accesses of the plurality of basic blocks; and
generating a hardware description language version of the design wherein the plurality of consecutive memory accesses are designated for implementation in hardware using a burst mode.

2. The method of claim 1, wherein the determining that the plurality of basic blocks represent a plurality of consecutive memory accesses comprises:
grouping the plurality of basic blocks into a plurality of regions, wherein each region includes two or more basic blocks of the plurality of basic blocks and has a single entry point and a single exit point.

3. The method of claim 2, further comprising:
determining that the plurality of memory accesses of the plurality of regions are consecutive.

4. The method of claim 3, wherein the plurality of consecutive memory accesses of the sequential access object include the plurality of memory accesses of the plurality of regions determined to be consecutive.

5. The method of claim 2, wherein each region represents an instance of a body portion of a loop construct of the design.

6. The method of claim 5, further comprising:
determining that the memory accesses of the instances of the body portion of the loop construct are consecutive.

7. The method of claim 6, wherein the plurality of consecutive memory accesses of the sequential access object include the plurality of memory accesses of the instances of the body portion of the loop construct.

8. The method of claim 6, wherein the loop construct is an inner loop contained in an outer loop, the method further comprising:
determining that memory accesses of each repetition of the inner loop, as controlled by the outer loop, are consecutive;
wherein the plurality of consecutive memory accesses of the sequential access object include the plurality of memory accesses of each repetition of the inner loop, as controlled by the outer loop.

9. A system, comprising:
a processor configured to initiate operations including:
generating an intermediate representation of a design specified in a high-level programming language, wherein the intermediate representation is specified as a control flow graph;
detecting a plurality of basic blocks in the control flow graph;
determining that the plurality of basic blocks represent a plurality of consecutive memory accesses;
generating a sequential access object specifying the plurality of consecutive memory accesses of the plurality of basic blocks; and
generating a hardware description language version of the design wherein the plurality of consecutive memory accesses are designated for implementation in hardware using a burst mode.

10. The system of claim 9, wherein the determining that the plurality of basic blocks represent a plurality of consecutive memory accesses comprises:
grouping the plurality of basic blocks into a plurality of regions, wherein each region includes two or more basic blocks of the plurality of basic blocks and has a single entry point and a single exit point.

11. The system of claim 10, wherein the processor is configured to initiate operations further comprising:
determining that the plurality of memory accesses of the plurality of regions are consecutive.

12. The system of claim 11, wherein the plurality of consecutive memory accesses of the sequential access object include the plurality of memory accesses of the plurality of regions determined to be consecutive.

13. The system of claim 10, wherein each region represents an instance of a body portion of a loop construct of the design.

14. The system of claim 13, wherein the processor is configured to initiate operations further comprising:
determining that the memory accesses of the instances of the body portion of the loop construct are consecutive.

15. The system of claim 14, wherein the plurality of consecutive memory accesses of the sequential access object include the plurality of memory accesses of the instances of the body portion of the loop construct.

16. The system of claim 14, wherein the loop construct is an inner loop contained in an outer loop, wherein the processor is configured to initiate operations further comprising:
determining that memory accesses of each repetition of the inner loop, as controlled by the outer loop, are consecutive;
wherein the plurality of consecutive memory accesses of the sequential access object include the plurality of memory accesses of each repetition of the inner loop, as controlled by the outer loop.

17. A computer program product, comprising:
one or more computer readable storage media, and program instructions collectively stored on the one or more computer readable storage media, wherein the program instructions are executable by computer hardware to initiate operations including:
generating an intermediate representation of a design specified in a high-level programming language, wherein the intermediate representation is specified as a control flow graph;
detecting a plurality of basic blocks in the control flow graph;

determining that the plurality of basic blocks represent a plurality of consecutive memory accesses;

generating a sequential access object specifying the plurality of consecutive memory accesses of the plurality of basic blocks; and generating a hardware description language version of the design wherein the plurality of consecutive memory accesses are designated for implementation in hardware using a burst mode.

18. The computer program product of claim 17, wherein the determining that the plurality of basic blocks represent a plurality of consecutive memory accesses comprises:

grouping the plurality of basic blocks into a plurality of regions, wherein each region includes two or more basic blocks of the plurality of basic blocks and has a single entry point and a single exit point; and determining that the plurality of memory accesses of the plurality of regions are consecutive.

19. The computer program product of claim 18, wherein each region represents an instance of a body portion of a loop construct of the design, and wherein the program instructions are executable by computer hardware to initiate operations including:

determining that the memory accesses of the instances of the body portion of the loop construct are consecutive.

20. The computer program product of claim 19, wherein the loop construct is an inner loop contained in an outer loop, and wherein the program instructions are executable by computer hardware to initiate operations including:

determining that memory accesses of each repetition of the inner loop, as controlled by the outer loop, are consecutive;

wherein the plurality of consecutive memory accesses of the sequential access object include the plurality of memory accesses of each repetition of the inner loop, as controlled by the outer loop.

* * * * *